(12) United States Patent
Matsuda et al.

(10) Patent No.: US 7,915,786 B2
(45) Date of Patent: Mar. 29, 2011

(54) ELASTIC BOUNDARY WAVE DEVICE

(75) Inventors: Takashi Matsuda, Kawasaki (JP);
Satoru Matsuda, Kawasaki (JP);
Michio Miura, Kawasaki (JP)

(73) Assignee: Taiyo Yuden Co., Ltd., Taiti-Ku, Tokyo (JP)

( * ) Notice: Subject to any disclaimer, the term of this patent is extended or adjusted under 35 U.S.C. 154(b) by 0 days.

(21) Appl. No.: 12/705,565

(22) Filed: Feb. 12, 2010

(65) Prior Publication Data

US 2010/0141088 A1  Jun. 10, 2010

Related U.S. Application Data

(63) Continuation of application No. PCT/JP2007/065855, filed on Aug. 14, 2007.

(51) Int. Cl.
*H01L 41/08* (2006.01)
(52) U.S. Cl. .............. 310/313 A; 310/313 R; 310/313 D
(58) Field of Classification Search .............. 310/313 A, 310/313, 313 D
See application file for complete search history.

(56) References Cited

U.S. PATENT DOCUMENTS

| | | | |
|---|---|---|---|
| 5,694,096 A | 12/1997 | Ushiroku et al. | |
| 7,259,498 B2 | 8/2007 | Nakatsuka et al. | |
| 7,501,916 B2 * | 3/2009 | Kando | 333/194 |
| 7,581,306 B2 * | 9/2009 | Kadota et al. | 29/594 |
| 7,642,694 B2 * | 1/2010 | Kando | 310/313 R |
| 7,659,653 B2 * | 2/2010 | Matsuda et al. | 310/313 B |
| 7,741,931 B2 * | 6/2010 | Matsuda et al. | 333/133 |
| 2005/0057117 A1 | 3/2005 | Nakatsuka et al. | |
| 2006/0138902 A1 | 6/2006 | Kando | |
| 2006/0220494 A1 | 10/2006 | Miura et al. | |
| 2007/0210676 A1 | 9/2007 | Matsuda et al. | |
| 2008/0067896 A1 | 3/2008 | Inoue et al. | |
| 2009/0115287 A1 | 5/2009 | Kando | |
| 2009/0212659 A1 | 8/2009 | Matsuda et al. | |

FOREIGN PATENT DOCUMENTS

| | | |
|---|---|---|
| EP | 1 517 444 A3 | 8/2005 |
| JP | 5-63500 A | 3/1993 |
| JP | 2005-117641 A | 4/2005 |
| JP | 2006-279609 A | 10/2006 |
| JP | 2007-243473 A | 9/2007 |
| JP | 2008-072316 A | 3/2008 |
| WO | WO-98/52279 A1 | 11/1998 |
| WO | WO-2005/069486 A1 | 7/2005 |
| WO | WO-2006/114930 A1 | 11/2006 |

* cited by examiner

*Primary Examiner* — Mark Budd
(74) *Attorney, Agent, or Firm* — Arent Fox LLP (57) ABSTRACT

An elastic boundary wave device of the present invention includes a plurality of elastic boundary wave elements. The elastic boundary wave elements each include a piezoelectric material layer, an electrode disposed over the piezoelectric material layer, a first dielectric layer formed over the piezoelectric material layer so as to cover the electrode, and a second dielectric layer formed over the first dielectric layer. An acoustic velocity of the second dielectric layers is faster than an acoustic velocity of the first dielectric layers, and the acoustic velocity of the second dielectric layer of at least one elastic boundary wave element from among the plurality of elastic boundary wave elements is different from the acoustic velocity of the second dielectric layer of another of the elastic boundary wave elements. This enables improving the degree of suppression in use as a filter in the elastic boundary wave device.

10 Claims, 10 Drawing Sheets

ELASTIC BOUNDARY WAVE DEVICE

CROSS-REFERENCE TO RELATED APPLICATION

This application is based upon and claims the benefit of priority of the prior International Patent Application No. PCT/JP2007/065855, filed on Aug. 14, 2007, the entire contents of which are incorporated herein by reference.

FIELD

The present invention relates to an elastic boundary wave device used in, for example, a several hundred MHz to several GHz high frequency filter.

BACKGROUND

Wireless mobile devices such as mobile phones have become increasingly multifunctional, and there is demand for their size to be smaller. A reduction in the size and thickness of the devices is therefore required. High frequency filters used in mobile phone devices are generally a SAW filter that employs surface acoustic waves (SAW), an FBAR filter that employs the piezoelectric oscillation of a thin film, or the like. Features of resonators and filters that employ elastic waves include being small and inexpensive. Elastic wave elements are therefore essential to reducing the size of communication devices such as mobile phones.

Examples of elastic wave elements include a surface acoustic wave element and an elastic boundary wave element that include comb-shaped electrodes that are formed on a piezoelectric substrate, piezoelectric thin film, or the like from an alloy whose main component is aluminum, an alloy whose main component is copper, or the like, and that have a period corresponding to a desired frequency, and such elements employ elastic waves that are excited by the comb-shaped electrodes. Also, examples of elastic wave elements include a resonator, a filter, and a duplexer. For example, in the case of a 1 terminal pair (1 port) resonator, a dual resonance characteristic of having a resonance frequency and an antiresonance frequency is exhibited. Employing this characteristic has enabled the practical use of ladder filters in which 1 port resonators that have different comb-shaped electrode periods are connected in series and in parallel to form a ladder shape. Other examples include a DMS (Double mode SAW) filter in which a resonator is formed by a plurality of comb-shaped electrodes, and an IIDT filter that has an excitation comb-shaped electrode and a reception comb-shaped electrode.

Surface acoustic wave elements employ waves that travel across the surface, and therefore space is necessary on the surface of surface acoustic wave elements (e.g., see Patent Document 1 and Patent Document 2). For this reason, a package in which the surface has space thereon is necessary, which has been a hindrance to a reduction in the thickness of the overall device. In view of this, elastic boundary wave elements have been developed as elastic wave elements in which space on the surface is not necessary (e.g., see Patent Document 3). Patent Document 3 discloses an elastic boundary wave element that has a piezoelectric material layer made from a piezoelectric substrate, a piezoelectric thin film, or the like, at least two types of dielectric layers, namely a first dielectric layer and a second dielectric layer, on the piezoelectric material layer, and furthermore a comb-shaped electrode that has been formed in the vicinity of the surface of the piezoelectric material layer on the first dielectric layer side and whose period $\lambda$ corresponds to a desired frequency. With the elastic boundary wave element disclosed in Patent Document 3, the peaks of the wave energy are in the first dielectric layer.

Note that Patent Document 4 is a technical document relating to the present invention.

Patent Document 1: Japanese Laid-open Patent Publication No. 05-63500
Patent Document 2: U.S. Pat. No. 5,694,096
Patent Document 3: International Publication Pamphlet No. WO 98/52279
Patent Document 4: Japanese Laid-open Patent Publication No. 2005-117641

With a structure in which boundary waves are almost entirely confined within the first dielectric layer, as in the elastic boundary wave element disclosed in Patent Document 3, it has been found that there is generation of boundary waves having a frequency different from the desired frequency and having a maximum amplitude on the first dielectric layer side in the vicinity of the boundary between the second dielectric layer and the first dielectric layer (hereinafter, also called "unnecessary waves 1"). Also, as waves that are likewise unnecessary, it has been found that there is generation of unnecessary waves due to the leakage of displacement up to the surface of the elastic boundary wave element (i.e., the surface of the second dielectric layer) (hereinafter, also called "unnecessary waves 2").

The above-described unnecessary waves 2 are surface waves, and can be suppressed by providing an acoustic absorption unit on the surface of the elastic boundary wave element or providing a scatter pattern on the surface of the second dielectric layer of the elastic boundary wave element. However, the above-described unnecessary waves 1 are boundary waves, and cannot be suppressed by providing an acoustic absorption unit or the like.

SUMMARY

An elastic boundary wave device of the present invention is an elastic boundary wave device including a plurality of elastic boundary wave elements, the elastic boundary wave elements each including a piezoelectric material layer, an electrode disposed over the piezoelectric material layer, a first dielectric layer formed over the piezoelectric material layer so as to cover the electrode, and a second dielectric layer formed over the first dielectric layer, an acoustic velocity of the second dielectric layers being faster than an acoustic velocity of the first dielectric layers, and the acoustic velocity of the second dielectric layer of at least one elastic boundary wave element from among the plurality of elastic boundary wave elements being different from the acoustic velocity of the second dielectric layer of another of the elastic boundary wave elements.

The object and advantages of the invention will be realized and attained by means of the elements and combinations particularly pointed out in the claims It is to be understood that both the foregoing general description and the following detailed description are exemplary and explanatory and are not restrictive of the invention, as claimed.

DESCRIPTION OF EMBODIMENTS

An elastic boundary wave device of the present invention includes a plurality of elastic boundary wave elements, and the plurality of elastic boundary wave elements are connected in series and in parallel. This enables configuring various types of filters.

Also, the elastic boundary wave elements each include a piezoelectric material layer, an electrode disposed over the piezoelectric material layer, a first dielectric layer formed over the piezoelectric material layer so as to cover the electrode, and a second dielectric layer formed over the first dielectric layer, and an acoustic velocity of the second dielectric layers has been set faster than an acoustic velocity of the first dielectric layers. This enables containing the boundary waves within the first dielectric layer.

Furthermore, the acoustic velocity of the second dielectric layer of at least one elastic boundary wave element from among the plurality of elastic boundary wave elements is different from the acoustic velocity of the second dielectric layer of another of the elastic boundary wave elements. This enables improving the degree of suppression at the frequency of unnecessary waves in use as a filter.

Preferably, the elastic boundary wave elements are each a 1 terminal pair resonator. In the case of a 1 terminal pair resonator, a dual resonance characteristic of having a resonance frequency and an antiresonance frequency is exhibited, and employing this characteristic enables configuring a ladder filter in which 1 terminal pair resonators that have different comb-shaped electrode periods are connected in series and in parallel to form a ladder shape.

The acoustic velocity of the second dielectric layer of at least one elastic boundary wave element from among the elastic boundary wave elements connected in parallel may be different from the acoustic velocity of the second dielectric layer of another of the elastic boundary wave elements. This also enables improving the degree of suppression at the frequency of unnecessary waves in use as a filter.

The acoustic velocity of at least one second dielectric layer from among the elastic boundary wave elements connected in series, and the acoustic velocity of the second dielectric layer of at least one elastic boundary wave element from among the elastic boundary wave elements connected in parallel may be different from the acoustic velocity of the second dielectric layer of another of the elastic boundary wave elements. This also enables improving the degree of suppression at the frequency of unnecessary waves in use as a filter.

The acoustic velocity of the second dielectric layer of at least one elastic boundary wave element from among the elastic boundary wave elements connected in series may be different from the acoustic velocity of the second dielectric layer of another of the elastic boundary wave elements. This also enables improving the degree of suppression at the frequency of unnecessary waves in use as a filter.

A piezoelectric substrate, piezoelectric thin film, or the like may be used as the piezoelectric material layer, and preferably the piezoelectric material layers have each been formed from $LiNbO_3$ or $LiTaO_3$. This is because the above have a somewhat high $k^2$ and are normally used in ladder filters and double mode filters. It is sufficient for the crystal orientation of $LiNbO_3$ and $LiTaO_3$ to be selected in consideration of $k^2$, temperature characteristics, propagation loss, and the like.

Preferably, the first dielectric layers include $SiO_2$ as a main component. $SiO_2$ is preferable due to having an effect of improving the temperature characteristics. In the present description, "containing . . . as a main component" refers to containing greater than or equal to 50% by weight.

Preferably, the second dielectric layers include, as a main component, any one selected from the group consisting of alumina, SiN, SiC, and diamond-like carbon. Accordingly, in the case in which the first dielectric layers are formed from $SiO_2$, it is possible to cause the acoustic velocity of the second dielectric layers to be faster than the acoustic velocity of the first dielectric layers.

A formation method for the second dielectric layer of at least one elastic boundary wave element from among the plurality of elastic boundary wave elements may be different from a formation method for the second dielectric layer of another of the elastic boundary wave elements. This is because changing the formation method for the second dielectric layers while keeping the material of the second dielectric layers the same enables changing the acoustic velocity of the second dielectric layers. Sputtering, CVD, or the like can be used as the formation method for the second dielectric layers.

Below is a description of embodiments of the present invention based on the drawings.

Figure 1:
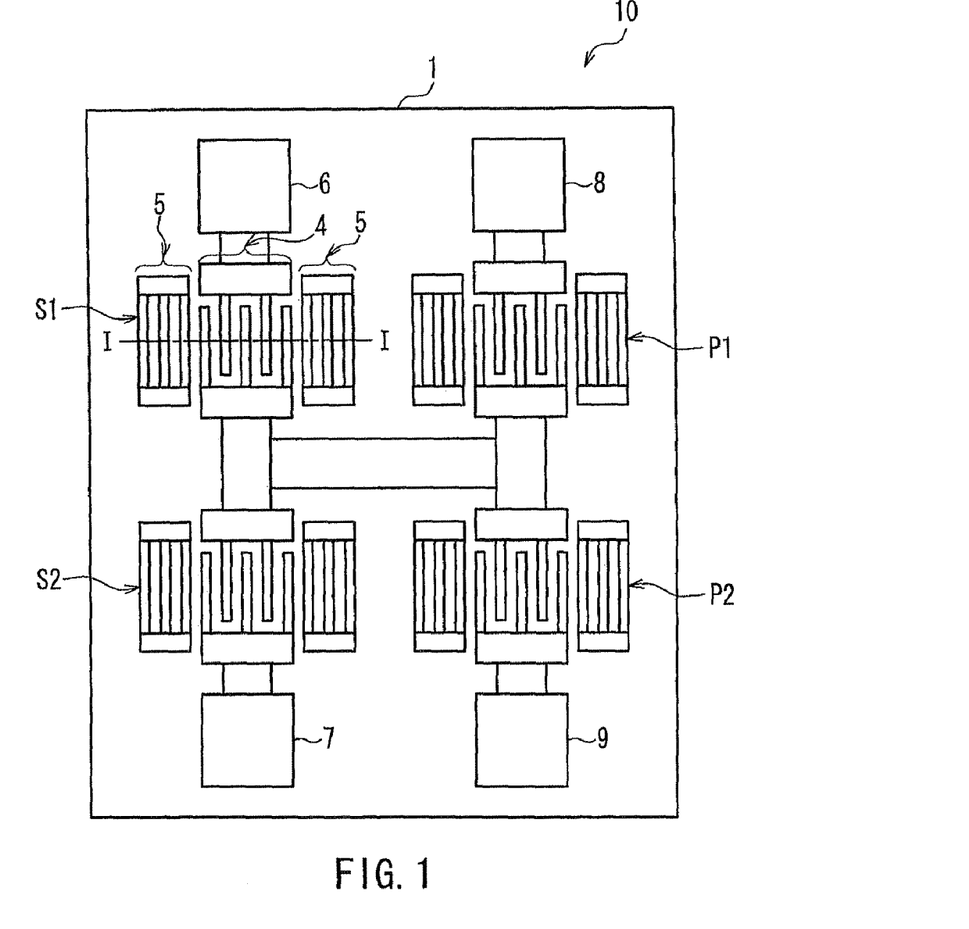
FIG. 1 is a plan view of an example of a ladder filter that includes a plurality of conventional elastic boundary wave elements (resonators).

FIG. 1 is a plan view showing an example of a ladder filter that includes a plurality of conventional elastic boundary wave elements (resonators). In FIG. 1, a ladder filter 10 includes an input terminal 6 and an output terminal 7, a resonator S1 and a resonator S2 are connected in series, a resonator P1 and a resonator P2 are connected in parallel, the resonator P1 is grounded via a terminal 8, and the resonator P2 is grounded via a terminal 9. The resonators S1, S2, P1, and P2 each include a comb-shaped electrode 4 and reflectors FIG. 1 is presented such that the circuit configuration of the comb-shaped electrode 4 and the like that are disposed on a piezoelectric substrate 1 are visible through a first dielectric layer and a second dielectric layer that are described later.

Figure 2:
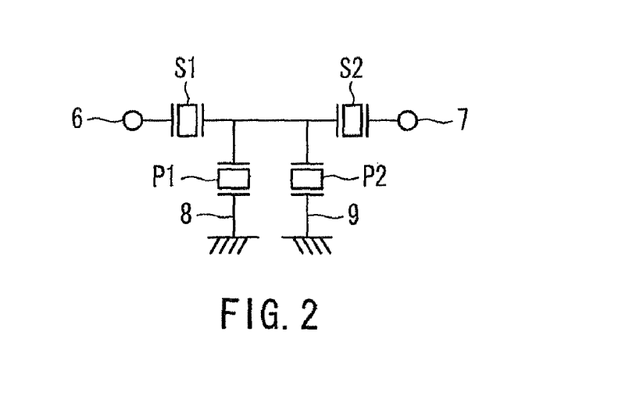
FIG. 2 is a diagram of a circuit configuration of the ladder filter illustrated in FIG. 1.

Also, FIG. 2 is a diagram showing the circuit configuration of the ladder filter shown in FIG. 1.

Figure 3:
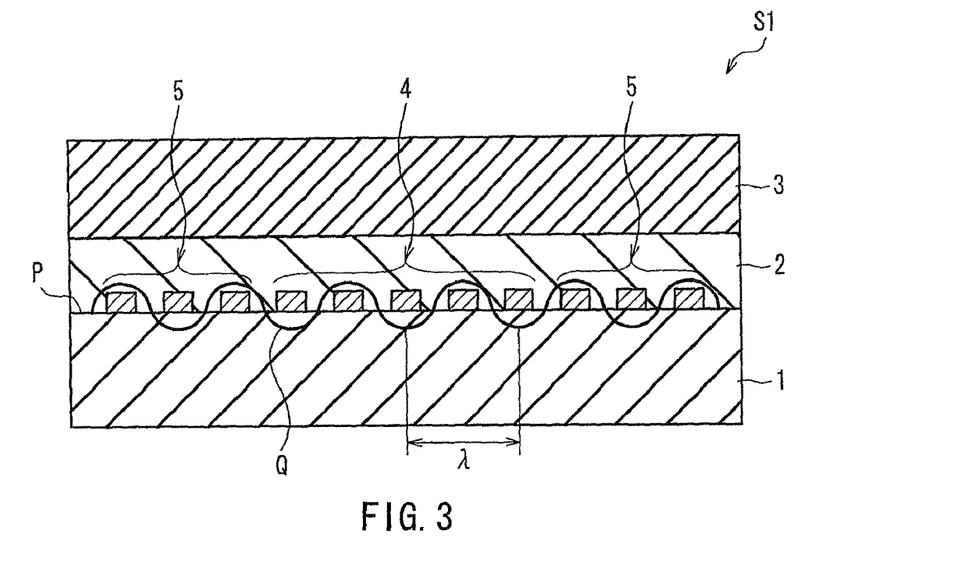
FIG. 3 is a cross-sectional diagram taken along line I-I in FIG. 1.

FIG. 3 is a cross-sectional diagram taken along line I-I in FIG. 1. In FIG. 3, the resonator S1 includes the piezoelectric substrate 1, the comb-shaped electrode 4 disposed on the piezoelectric substrate 1, a first dielectric layer 2 formed on the piezoelectric substrate 1 so as to cover the comb-shaped electrode 4, and a second dielectric layer 3 formed on the first dielectric layer 2. Also, the reflectors 5 are disposed on each side of the comb-shaped electrode 4 in the elastic boundary wave propagation direction.

In the resonator S1, an elastic boundary wave Q is excited by applying an input signal to the comb-shaped electrode 4, and as schematically shown in FIG. 3, the elastic boundary wave Q propagates along an interface P of the piezoelectric substrate 1 and the first dielectric layer 2. To achieve this, the acoustic velocity of the second dielectric layer 3 needs to be faster than the acoustic velocity of the first dielectric layer 2. Also, when the wavelength of the elastic boundary wave Q is λ, the thickness of the second dielectric layer 3 is preferably greater than or equal to 1.0λ. This enables reliably containing the elastic boundary wave Q within the first dielectric layer 2.

Although the comb-shaped electrode 4 is disposed on the piezoelectric substrate 1 in FIG. 3, a dielectric thin film may further be disposed between the piezoelectric substrate 1 and the comb-shaped electrode 4.

The period of the comb-shaped electrode 4 is determined according to an acoustic velocity v and a desired frequency f of the boundary wave that are principal responses in use as a filter, and the relationship $v[m/s]=f[Hz]\times\lambda[m]$ is satisfied. For example, take the case of creating a filter whose central frequency is approximately 1.8 GHz and the acoustic velocity that is a boundary wave principal response is approximately 3,660 m/s when a 15-degree rotation Y-cut X propagation $LiNbO_3$ substrate is used as the piezoelectric substrate 1, $SiO_2$ (thickness: 1,050 nm) is used as the first dielectric layer 2, alumina (thickness: 2 μm) is used as the second dielectric layer 3, and a Cu electrode (thickness: 315 nm) is used as the comb-shaped electrode 4; in this case, $\lambda\approx2$ μm. In the design of ladder filters, the period of the resonators connected in series (series resonators) and the period of the resonators connected in parallel (parallel resonators) are caused to be different, and the antiresonance frequency of the parallel resonators and the resonance frequency of the series resonators are set so as to be substantially matching. The resonators S1, S2, P1, and P2 in FIG. 1 are examples of 1 terminal pair (1 port) resonators, and each includes the comb-shaped electrode 4 that excites boundary waves, and the reflectors 5. The acoustic velocity that is a boundary wave principal response varies according to the crystal orientation of the piezoelectric substrate 1 that is the portion along which the boundary waves mainly propagate, the material, density, elastic modulus, and thickness of the first dielectric layer 2, and the material, thickness, density, and elastic modulus of the comb-shaped electrode 4. For example, in a solid, if the elastic modulus is M [$N/m^2$] and the density is ρ[$kg/m^3$], the relationship $v=(M/\rho)^{1/2}$ is satisfied for the acoustic velocity v [m/s]. A necessary condition for containing boundary waves within the first dielectric layer 2 is that the acoustic velocity of the second dielectric layer 3 is faster than the acoustic velocity of the first dielectric layer 2. In an approach from the material aspect, in the case in which the first dielectric layer 2 is formed from, for example, $SiO_2$, a necessary condition for containing boundary waves within the first dielectric layer 2 is that the second dielectric layer 3 is formed from, for example, alumina, SiN, SiC, diamond-like carbon, diamond, or Si.

Features of boundary waves are that the energy of the waves is focused in the vicinity of the boundary interface of the first dielectric layer 2 and the piezoelectric substrate 1, and that there is almost no leakage into the second dielectric layer 3, and the acoustic velocity of the second dielectric layer 3 has little influence on the frequency of the boundary waves, which is a principal response.

Figure 4:
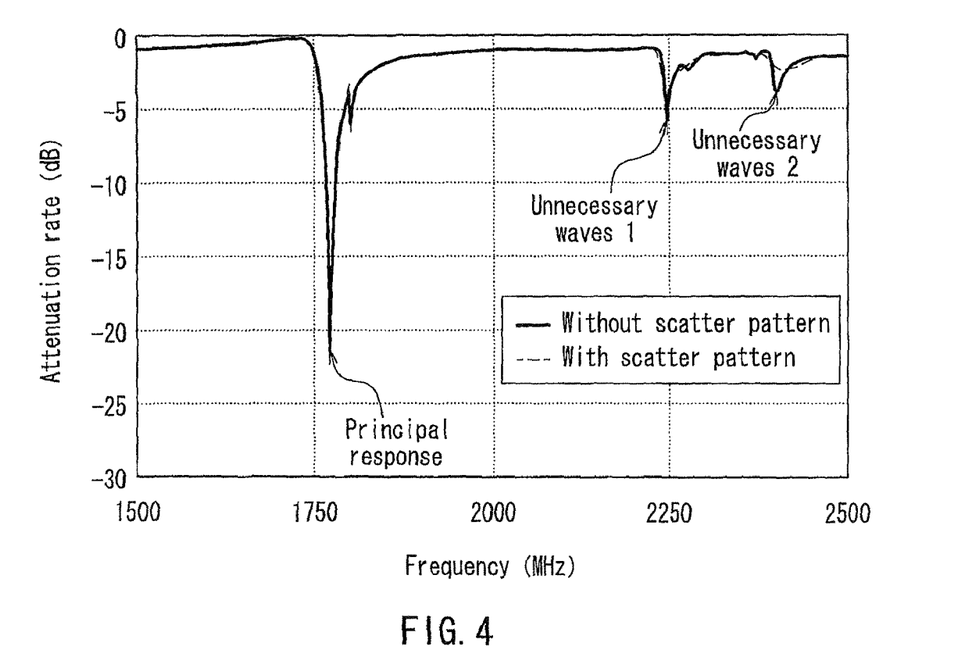
FIG. 4 is a diagram of characteristics of a stand-alone 1 port resonator illustrated in FIG. 1.

FIG. 4 is a diagram showing characteristics of a stand-alone 1 port resonator shown in FIG. 1, in the exemplary case in which a 15-degree rotation Y-cut X propagation $LiNbO_3$ substrate is used as the piezoelectric substrate 1, $SiO_2$ (thickness: 1,050 nm) is used as the first dielectric layer 2, an alumina sputter film (thickness: 2 μm) is used as the second dielectric layer 3, and a Cu electrode (thickness: 315 nm) is used as the comb-shaped electrode 4. FIG. 4 shows cases in which a scatter pattern has been formed and has not been formed on the surface of the second dielectric layer 3. It is evident from FIG. 4 that in the resonators, the unnecessary waves 1 and unnecessary waves 2 are generated in addition to the boundary wave principal response. The unnecessary waves 1 are boundary waves that have displaced peaks on the first dielectric layer 2 side in the vicinity of the boundary between the first dielectric layer 2 and the second dielectric layer 3. The unnecessary waves 2 are surface waves that have displaced peaks at the surface of the second dielectric layer 3. As is evident from FIG. 4, it is possible to somewhat suppress the unnecessary waves 2 by forming an acoustic absorption layer or forming a scatter pattern that scatters the waves, on the surface of the second dielectric layer 3. However, the unnecessary waves 1 are boundary waves, and therefore cannot be suppressed by forming the acoustic absorption layer or scatter pattern.

Figure 5:
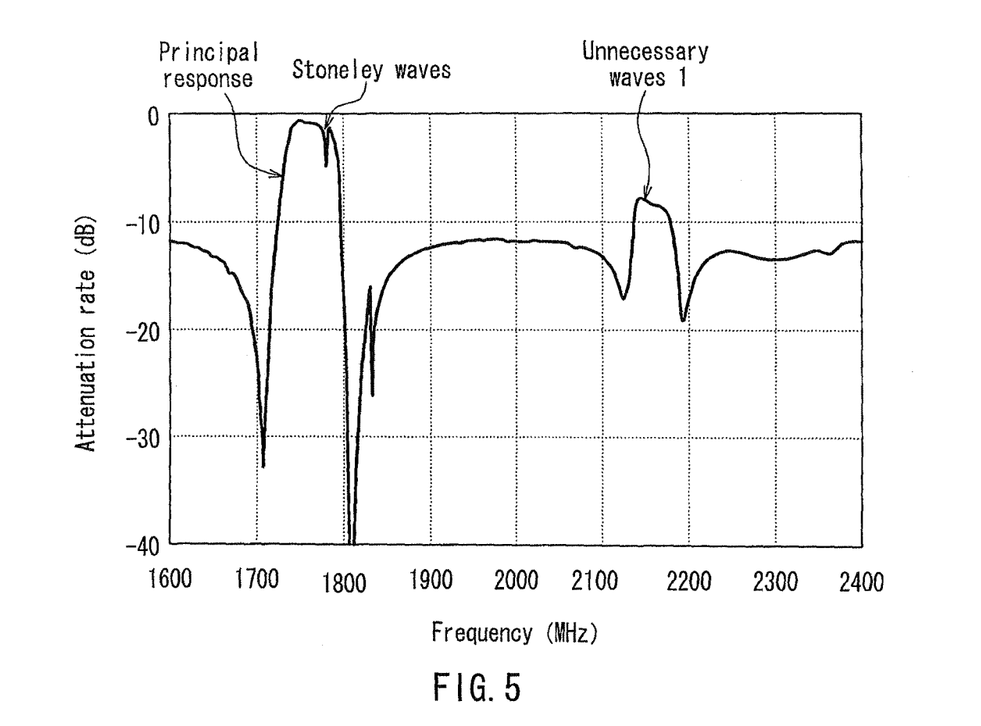
FIG. 5 is a diagram of frequency characteristics when a ladder filter is formed by combining resonators in which the unnecessary waves 2 in FIG. 4 have been suppressed.

FIG. 5 is a diagram showing frequency characteristics when a ladder filter is formed by combining resonators in which the unnecessary waves 2 in FIG. 4 have been suppressed. It is evident that in addition to configuring a bandpass filter according to the principal response, unnecessary response is also generated due to the unnecessary waves 1, and the degree of suppression at the frequency of the unnecessary response has been worsened. The present invention achieves an improvement with respect to the degradation in degree of suppression due to the unnecessary waves 1 that are one type of such boundary waves. Note that although there is a small amount of unnecessary response in the passband of the principal response, this is due to Stoneley waves, and therefore such unnecessary response can be eliminated by optimizing the electrode film thickness, the orientation of the piezoelectric material, and the film thickness of the first dielectric layer.

Figure 6:
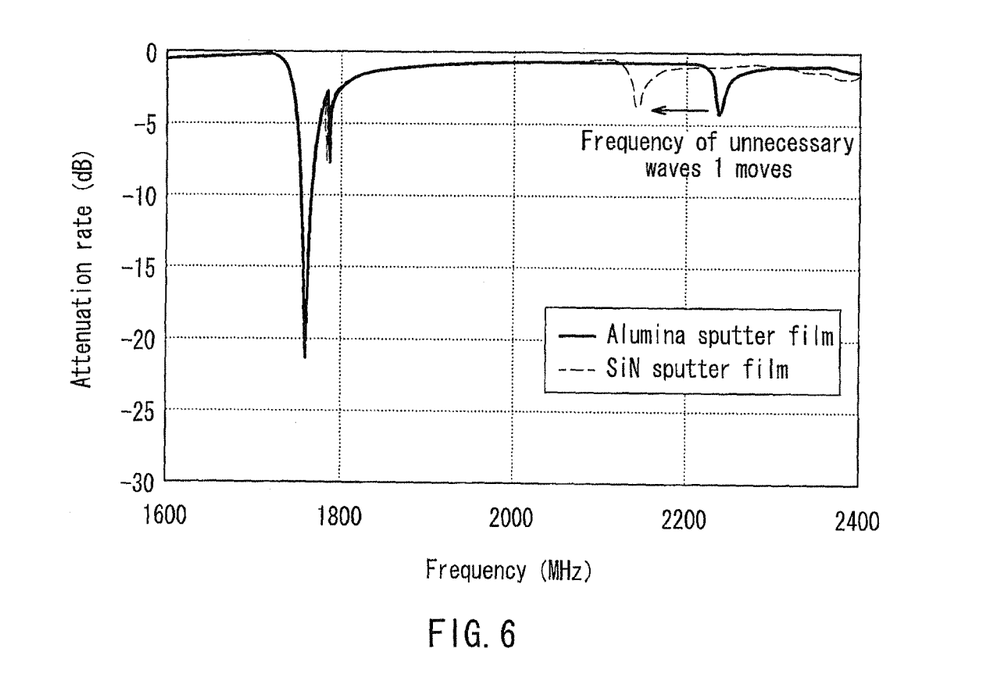
FIG. 6 is a diagram of a comparison of characteristics of stand-alone 1 port resonators.

The unnecessary waves 1 are boundary waves that originate in the first dielectric layer 2 and the second dielectric layer 3, and are influenced by the respective acoustic velocities thereof. In the case in which the material of the first dielectric layer 2 is determined, the unnecessary waves 1 shift to the high frequency side if the acoustic velocity of the second dielectric layer 3 is increased, and shift to the low frequency side if the acoustic velocity of the second dielectric layer 3 is decreased. FIG. 6 shows characteristics of stand-alone 1 port resonators in the case in which a 15-degree rotation Y-cut X propagation $LiNbO_3$ substrate is used as the piezoelectric substrate 1, $SiO_2$ (thickness: 1,050 nm) is used as the first dielectric layer 2, a Cu electrode (thickness: 315 nm) is used as the comb-shaped electrode 4, an SiN sputter film (thickness: 2 μm) and an alumina sputter film (thickness:

2 μm) are respectively used as the second dielectric layer 3, and a scatter pattern has been formed on the surface of the second dielectric layer 3 of each 1 port resonator. It is evident from FIG. 6 that compared to the case of using the alumina sputter film as the second dielectric layer 3, the frequency of the unnecessary waves 1 moves in the low frequency direction when the SiN sputter film is used.

Figure 7:
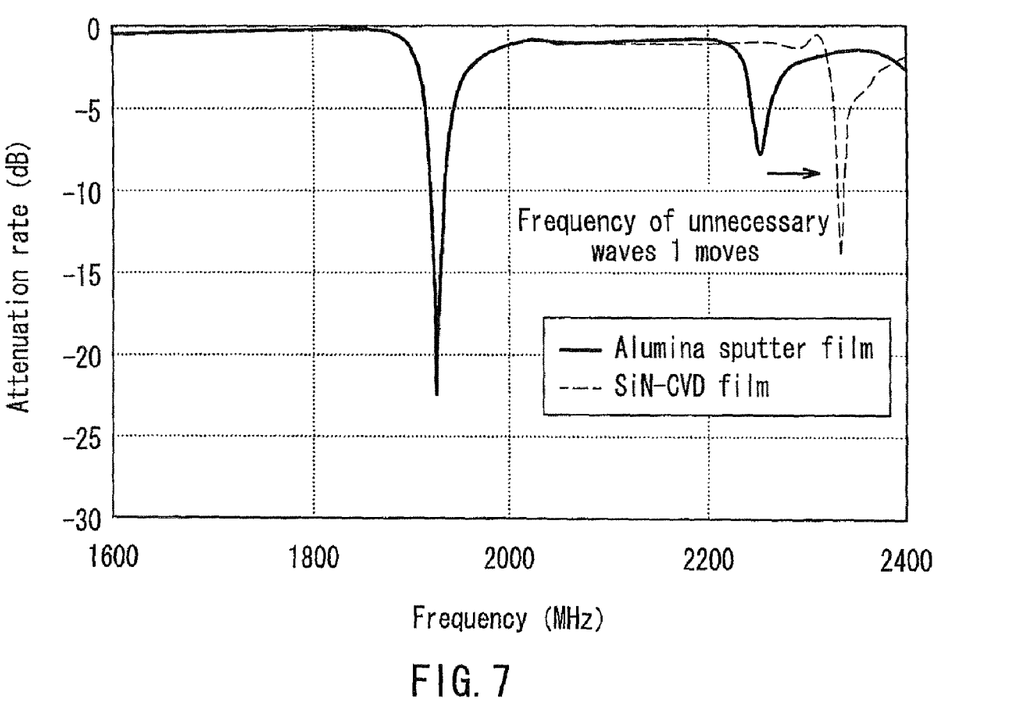
FIG. 7 is a diagram of a comparison of characteristics of stand-alone 1 port resonators.

Also, FIG. 7 shows characteristics of stand-alone 1 port resonators in the case in which a 30-degree rotation Y-cut X propagation LiNbO$_3$ substrate is used as the piezoelectric substrate 1, SiO$_2$ (thickness: 1,050 nm) is used as the first dielectric layer 2, a Cu electrode (thickness: 170 nm) is used as the comb-shaped electrode 4, an SiN plasma CVD film (thickness: 2 μm) and an alumina sputter film (thickness: 2 μm) are respectively used as the second dielectric layer 3, and a scatter pattern has been formed on the surface of the second dielectric layer 3 of each 1 port resonator. It is evident from FIG. 7 that compared to the case of using the alumina sputter film as the second dielectric layer 3, the frequency of the unnecessary waves 1 moves in the high frequency direction when the SiN plasma CVD film is used. In this way, it is evident that by not only changing the material of the second dielectric layers 3, but also by changing the film formation method when using the same material, the elastic modulus and density of the second dielectric layers 3 change, and the acoustic velocities change, as a result of which the frequency of the unnecessary waves 1 moves.

Figure 8:
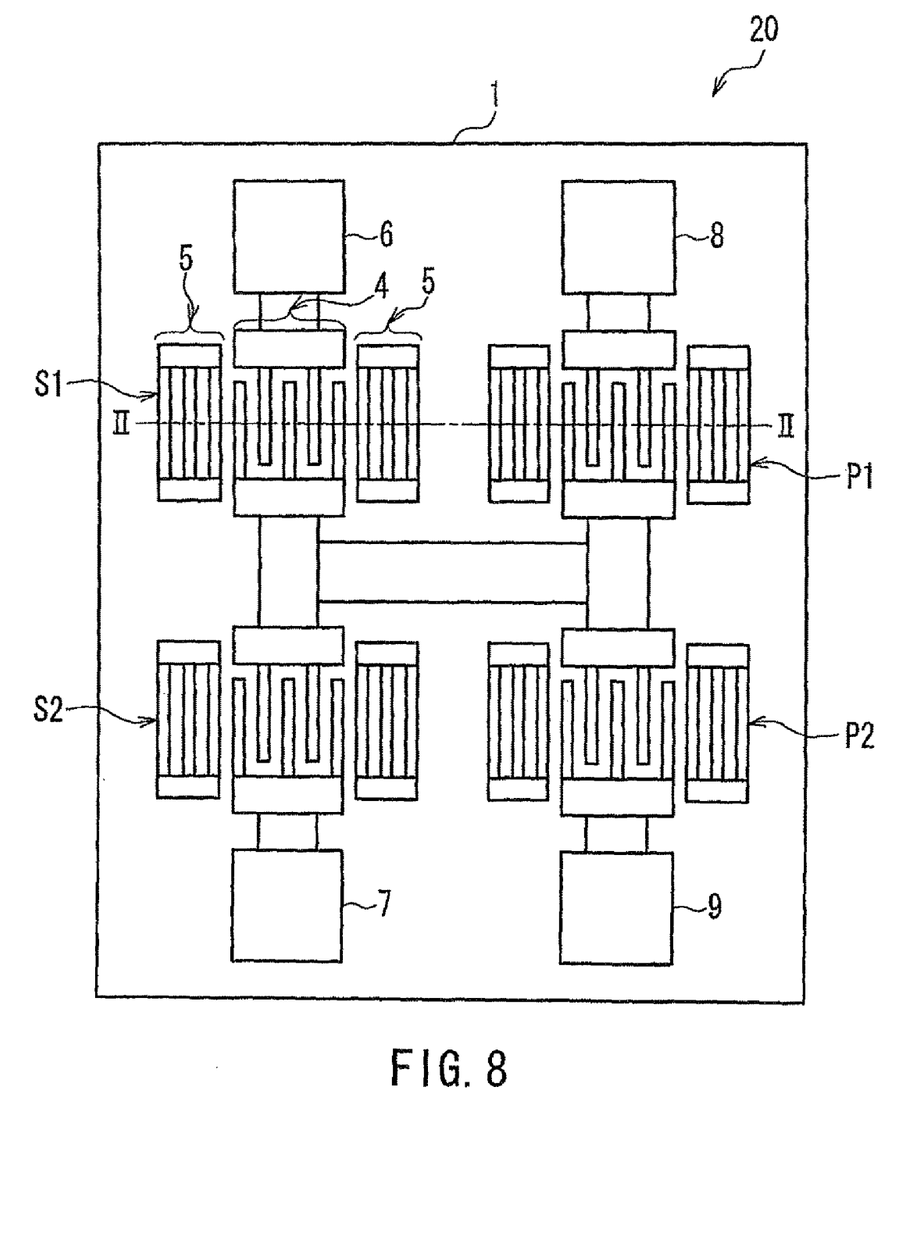
FIG. 8 is a plan view of an example of a ladder filter including a plurality of elastic boundary wave elements (resonators) of the present invention.

FIG. 8 is a plan view showing an example of a ladder filter that includes a plurality of elastic boundary wave elements (resonators) of the present invention. In FIG. 8, portions that are the same as in FIG. 1 have been given the same reference numerals, and some descriptions thereof have been omitted. A ladder filter 20 of the present embodiment is an example in which, among the four resonators, the second dielectric layer of S1, S2, and P2 is formed from an alumina sputter film, and only the second dielectric layer of P1 is formed from an SiN sputter film.

Figure 9:
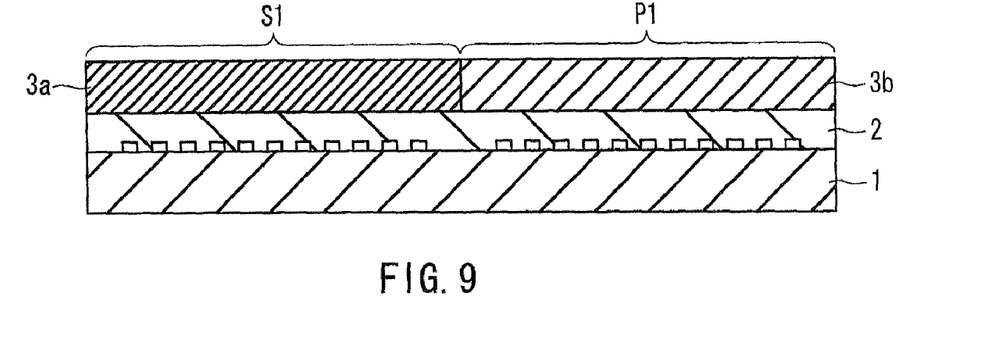
FIG. 9 is a cross-sectional diagram taken along line in FIG. 8.

FIG. 9 is a cross-sectional diagram taken along line II-II in FIG. 8. In FIG. 9, the resonator S1 includes the piezoelectric substrate 1 formed from LiNbO$_3$, the first dielectric layer 2 formed from SiO$_2$, and a second dielectric layer 3a formed from an alumina sputter film. The other resonators S2 and P2 have a similar configuration. However, in FIG. 9, the resonator P1 includes the piezoelectric substrate 1 formed from LiNbO$_3$, the first dielectric layer 2 formed from SiO$_2$, and a second dielectric layer 3b formed from an Sin sputter film. Using different materials for the second dielectric layers 3a and 3b of the resonator S1 and the resonator P1 enables causing the second dielectric layer 3a of the resonator S1 and the second dielectric layer 3b of the resonator P1 to have different acoustic velocities. In other words, the example in FIG. 9 is an example in which the acoustic velocity of the second dielectric layer of at least one elastic boundary wave element from among the elastic boundary wave elements (resonators) that are connected in parallel has been caused to be different from the acoustic velocity of the second dielectric layer of another of the elastic boundary wave elements.

The second dielectric layers 3a and 3b shown in FIG. 9 can be formed as described below. First, a resist pattern is formed such that alumina will be sputtered on the surface of the first dielectric layer 2 of the resonators S1, S2, and P2, alumina is then sputtered, and thereafter the resist is removed, thus forming the second dielectric layer 3a. Next, a resist pattern is formed such that SiN will be sputtered on only the surface of the first dielectric layer 2 of the resonator P1, SiN is then sputtered, and thereafter the resist is removed, thus forming the second dielectric layer 3b.

Figure 10:
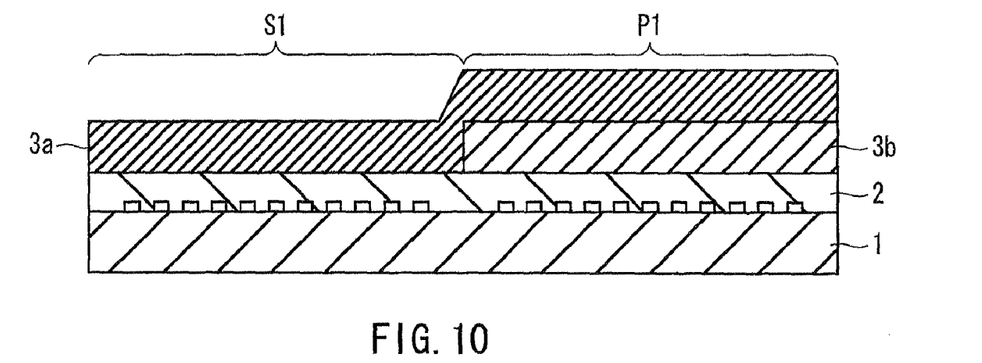
FIG. 10 is a cross-sectional diagram of a resonator S1 and a resonator P1 that have been formed using a formation method that is different from the formation method for second dielectric layers 3a and 3b illustrated in FIG. 9.

FIG. 10 is a cross-sectional diagram of the resonator S1 and the resonator P1 that have been formed using a formation method that is different from the formation method for the second dielectric layers 3a and 3b shown in FIG. 9. In FIG. 10, first a resist pattern is formed such that SiN will be sputtered on only the surface of the first dielectric layer 2 of the resonator P1, SiN is then sputtered, and thereafter the resist is removed, thus forming the second dielectric layer 3b. Next, alumina is sputtered on the surface of the resonators S1, S2, P1, and P2, thus forming the second dielectric layer 3a.

Figure 11:
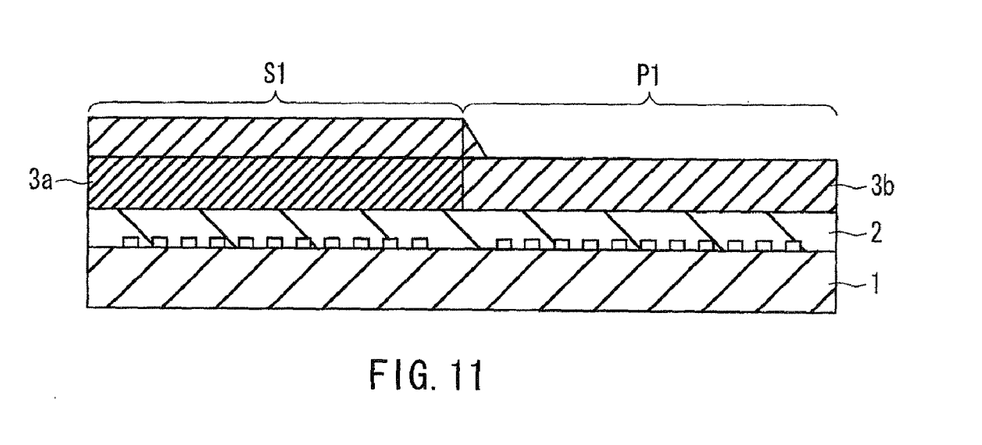
FIG. 11 is a cross-sectional diagram of the resonator S1 and the resonator P1 that have been formed using another formation method that is different from the formation method for the second dielectric layers 3a and 3b illustrated in FIG. 9.

FIG. 11 is a cross-sectional diagram of the resonator S1 and the resonator P1 that have been formed using another formation method that is different from the formation method for the second dielectric layers 3a and 3b shown in FIG. 9. In FIG. 11, first a resist pattern is formed such that alumina will be sputtered on only the surface of the first dielectric layer 2 of the resonator S1, alumina is then sputtered, and thereafter the resist is removed, thus forming the second dielectric layer 3a. Next, SiN is sputtered on the surface of the resonators S1, S2, P1, and P2, thus forming the second dielectric layer 3b.

As shown in FIG. 10 and FIG. 11, even when a material that is different from the second dielectric layers 3a and 3b is layered on part of the second dielectric layers 3a and 3b, there is no influence on the frequency of the unnecessary waves 1, which are boundary waves.

Figure 12A:
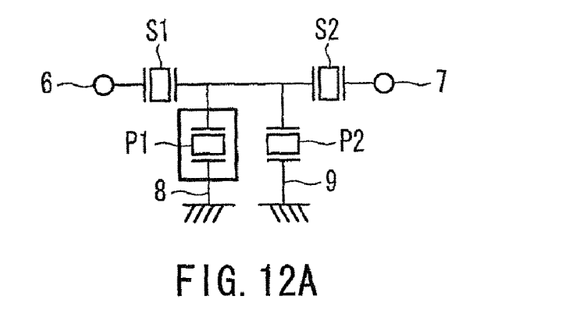
FIG. 12A is a diagram of a circuit configuration of the ladder filter illustrated in FIG. 8.
Figure 12B:
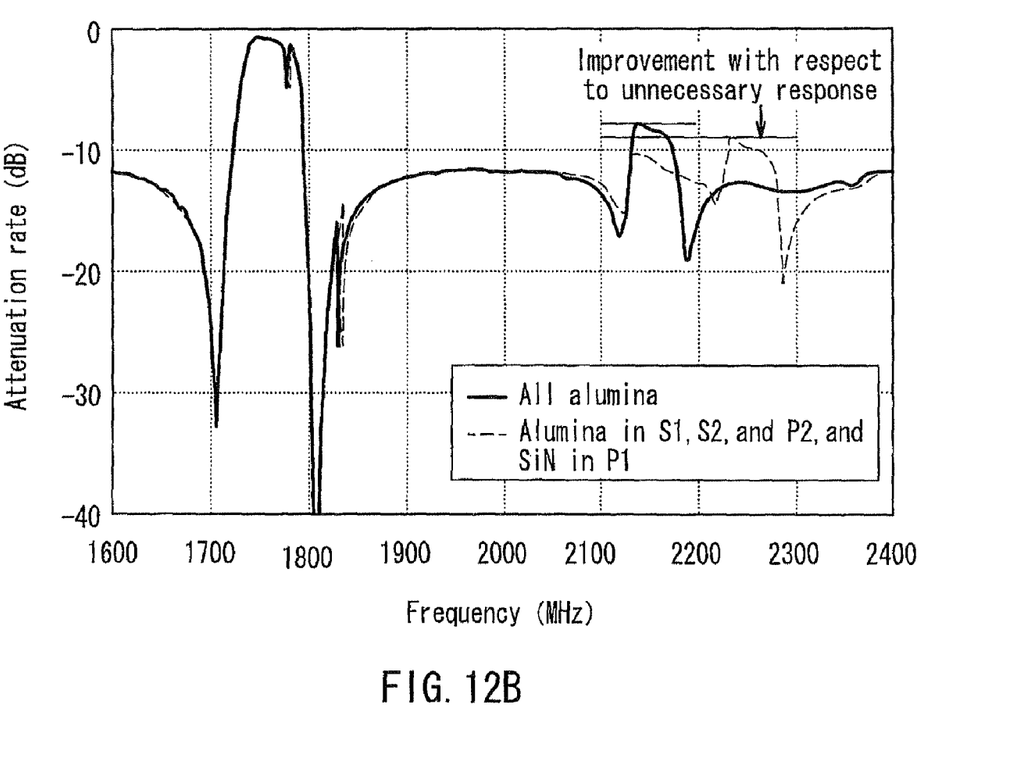
FIG. 12B is a diagram of frequency characteristics of the ladder filter illustrated in FIG. 8.

FIG. 12A is a diagram showing a circuit configuration of the ladder filter shown in FIG. 8. In FIG. 12A, the resonator P1 whose second dielectric layer 3 has an acoustic velocity that differs from the others is shown enclosed in a frame. Also, FIG. 12B is a diagram showing frequency characteristics of the ladder filter shown in FIG. 8. For comparison, FIG. 12B also shows the frequency characteristics of a configuration that is the same as the ladder filter shown in FIG. 8, with the exception that the second dielectric layers 3 of the resonators S1, S2, P1, and P2 have all been formed an alumina sputter film. It is evident from FIG. 12B that an improvement with respect to unnecessary response due to the unnecessary waves 1 is achieved by causing the acoustic velocity of the second dielectric layer of at least one elastic boundary wave element from among the plurality of elastic boundary wave elements (resonators) to be different from the acoustic velocity of the second dielectric layer of another of the elastic boundary wave elements.

Figure 13A:
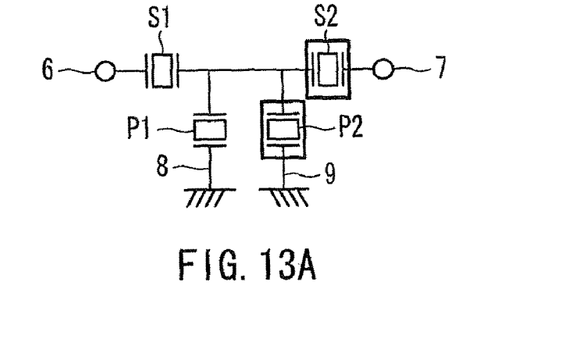
FIG. 13A is a diagram of a circuit configuration of another ladder filter.
Figure 13B:
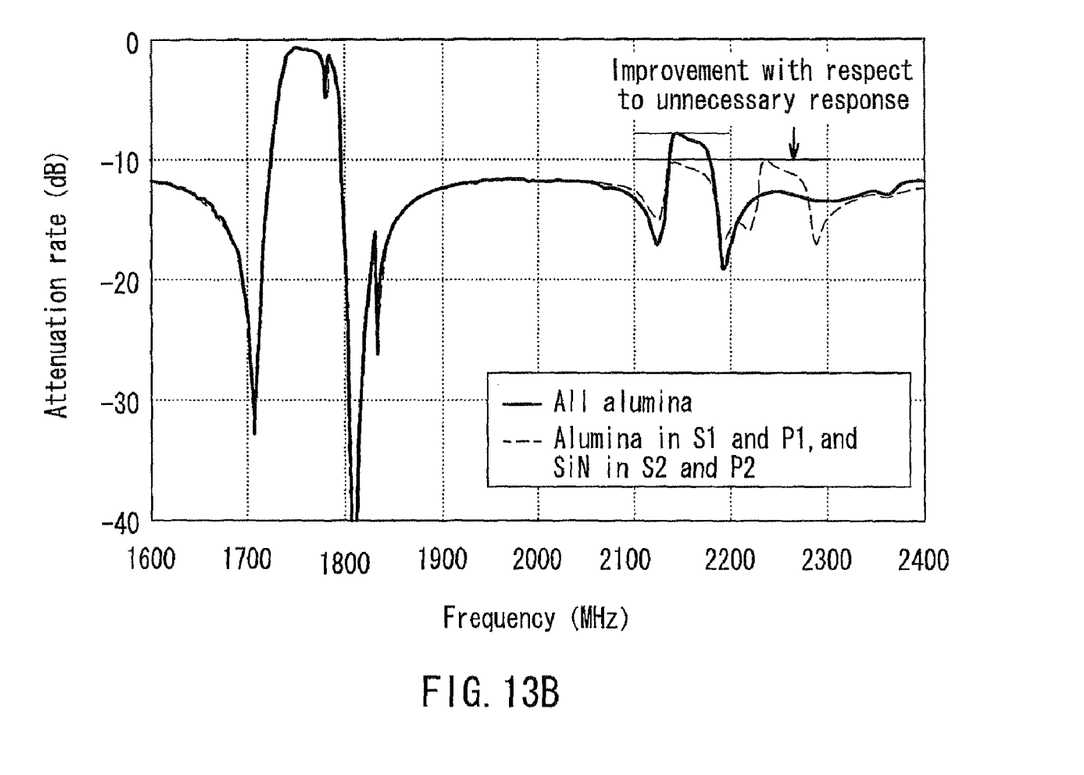
FIG. 13B is a diagram of frequency characteristics of the ladder filter illustrated in FIG. 13A.

Also, FIG. 13A is a diagram showing a circuit configuration of a ladder filter in which, among the four resonators, the second dielectric layer 3 of the resonator S1 and the resonator P1 is formed from an alumina sputter film, and the second dielectric layer 3 of the resonator S2 and the resonator P2 is formed from an SiN sputter film. In FIG. 13A, the resonators S2 and P2 whose second dielectric layers 3 have an acoustic velocity that differs from the others are shown enclosed in frames. In other words, the example in FIG. 13A is an example in which the acoustic velocity of at least one second dielectric layer from among the elastic boundary wave elements (resonators) connected in series, and the acoustic velocity of the second dielectric layer of at least one elastic boundary wave element from among the elastic boundary wave elements connected in parallel have been caused to be different from the acoustic velocity of the second dielectric layer of another of the elastic boundary wave elements. Also, FIG. 13B is a diagram showing frequency characteristics of the ladder filter shown in FIG. 13A. For comparison, FIG. 13B also shows the frequency characteristics of a configuration that is the same as the ladder filter shown in FIG. 13A, with the exception that the second dielectric layers 3 of the resonators S1, S2, P1, and P2 have all been formed from an alumina sputter film. It is evident from FIG. 13B that an improvement with respect to unnecessary response due to the unnecessary waves 1 is achieved by causing the acoustic velocity of the second dielectric layer of at least one elastic boundary wave element from among the plurality of elastic boundary wave elements (resonators) to be different from the acoustic velocity of the second dielectric layer of another of the elastic boundary wave elements.

Figure 14A:
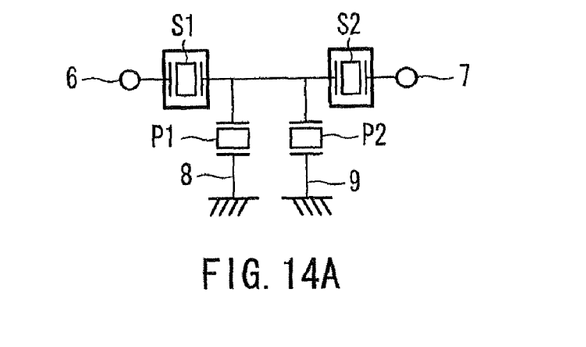
FIG. 14A is a diagram of a circuit configuration of yet another ladder filter.
Figure 14B:
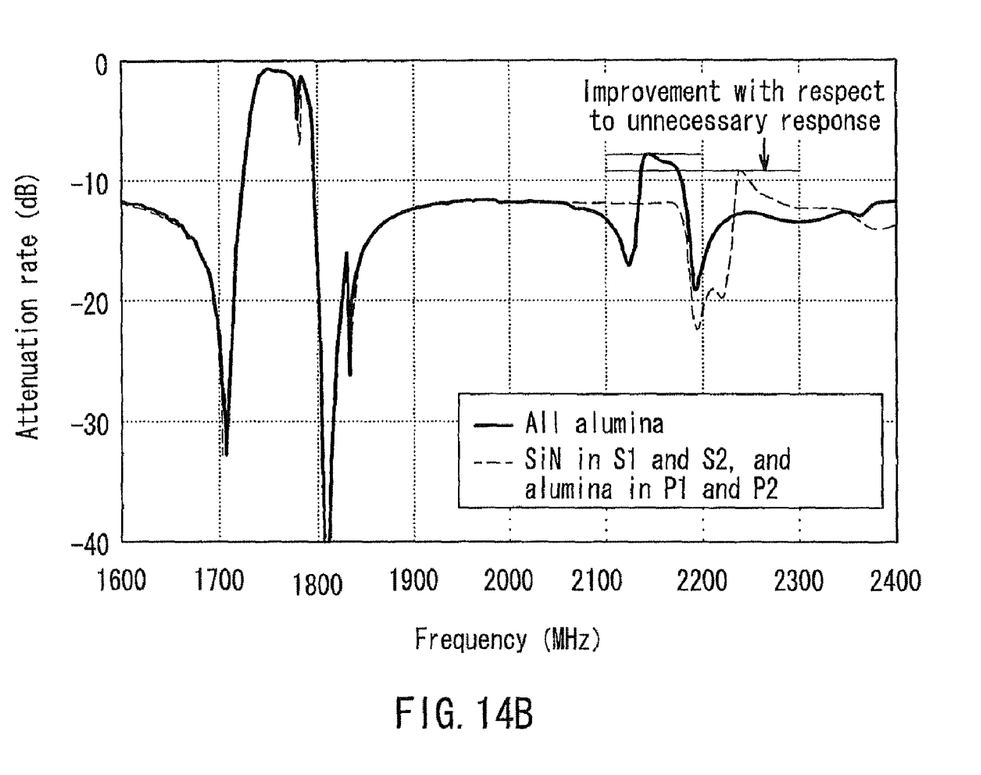
FIG. 14B is a diagram of frequency characteristics of the ladder filter illustrated in FIG. 14A.

Also, FIG. 14A is a diagram showing a circuit configuration of a ladder filter in which, among the four resonators, the second dielectric layer 3 of the resonator P1 and the resonator P2 is formed from an alumina sputter film, and the second dielectric layer 3 of the resonator S1 and the resonator S2 is formed from an SiN sputter film. In FIG. 14A, the resonators S1 and S2 whose second dielectric layers 3 have an acoustic velocity that differs from the others are shown enclosed in frames. In other words, the example of FIG. 14A is an example in which the acoustic velocity of the second dielectric layer of at least one elastic boundary wave element from among the elastic boundary wave elements (resonators) connected in series has been caused to be different from the acoustic velocity of the second dielectric layer of another of the elastic boundary wave elements. Also, FIG. 14B is a diagram showing frequency characteristics of the ladder filter shown in FIG. 14A. For comparison, FIG. 14B also shows the frequency characteristics of a configuration that is the same as the ladder filter shown in FIG. 14A, with the exception that the second dielectric layers 3 of the resonators S1, S2, P1, and P2 have all been formed from an alumina sputter film. It is evident from FIG. 14B that an improvement with respect to unnecessary response due to the unnecessary waves 1 is achieved by causing the acoustic velocity of the second dielectric layer of at least one elastic boundary wave element from among the plurality of elastic boundary wave elements (resonators) to be different from the acoustic velocity of the second dielectric layer of another of the elastic boundary wave elements. In particular, with the ladder filter shown in FIG. 14A, the height relationship between the frequency of the unnecessary waves 1 of the resonators connected in parallel and the frequency of the unnecessary waves 1 of the resonators connected in series is the inverse of such relationship in a normal ladder filter (normally, resonance frequency of series resonators>resonance frequency of parallel resonators), and therefore band rejection at the frequency of the unnecessary waves 1 is possible, and the degree of suppression of that portion can be greatly improved. For example, in the case in which there is a desire to improve the degree of suppression of a specific frequency, this can be accomplished by controlling the acoustic velocity of the second dielectric layers 3.

Figure 15:
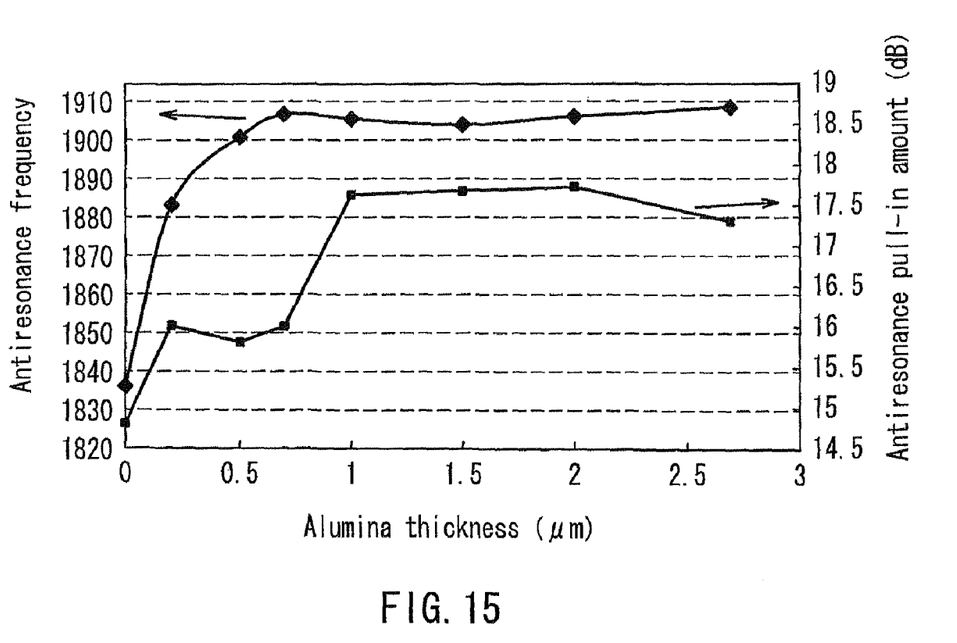
FIG. 15 is a diagram of a relationship between the thickness of alumina (second dielectric layer), antiresonance frequency, and antiresonance pull-in amount.

Lastly, the relationship between the thickness of the second dielectric layers and the wavelength $\lambda$ of the elastic boundary waves will be examined. FIG. 15 is a diagram showing a relationship between the thickness of alumina (second dielectric layer) and the antiresonance frequency and antiresonance pull-in amount of the elastic boundary waves. Shown in the embodiment of FIG. 15 is the relationship between the thickness of alumina (second dielectric layer) and the antiresonance frequency and antiresonance pull-in amount when a 30-degree rotation Y-cut X propagation $LiNbO_3$ substrate is used as the piezoelectric substrate, $SiO_2$ (thickness: 1,150 nm) is used as the first dielectric layer, alumina is used as the second dielectric layer, a Cu electrode (thickness: 185 nm, electrode period: 1.982 µm, elastic boundary wave wavelength $\lambda$: 1.982 µm) is used as the comb-shaped electrode, and the thickness of the alumina of the second dielectric layer has been varied. As shown in FIG. 15, the antiresonance frequency is stable when the thickness of the alumina is approximately 0.75 µm, and the antiresonance pull-in amount is stable when the thickness of the alumina is approximately 1 µm. Accordingly, it is evident that the thickness of the alumina needs to be greater than or equal to approximately 1 µm in order for both the antiresonance frequency and the antiresonance pull-in amount to be stable. It is therefore evident that the thickness of the second dielectric layer (alumina) needs to be greater than or equal to $0.5\lambda$ with respect to the elastic boundary wave wavelength $\lambda$ (approximately 2 µm).

As described above, the present invention enables improving the degree of suppression in use as a filter in an elastic boundary wave device by causing the acoustic velocity of a second dielectric layer of at least one elastic boundary wave element from among a plurality of elastic boundary wave elements to be different from the acoustic velocity of a second dielectric layer of another of the elastic boundary wave elements.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

The invention claimed is:

1. An elastic boundary wave device comprising a plurality of elastic boundary wave elements,
    the elastic boundary wave elements each comprising a piezoelectric material layer, an electrode disposed over the piezoelectric material layer, a first dielectric layer formed over the piezoelectric material layer so as to cover the electrode, and a second dielectric layer formed over the first dielectric layer,
    an acoustic velocity of the second dielectric layers being faster than an acoustic velocity of the first dielectric layers, and
    the acoustic velocity of the second dielectric layer of at least one elastic boundary wave element from among the plurality of elastic boundary wave elements being different from the acoustic velocity of the second dielectric layer of another of the elastic boundary wave elements.

2. The elastic boundary wave device according to claim 1, wherein the plurality of elastic boundary wave elements are connected in series and in parallel.

3. The elastic boundary wave device according to claim 2, wherein the elastic boundary wave elements are each a 1 terminal pair resonator.

4. The elastic boundary wave device according to claim 2, wherein the acoustic velocity of the second dielectric layer of at least one elastic boundary wave element from among the elastic boundary wave elements connected in parallel is different from the acoustic velocity of the second dielectric layer of another of the elastic boundary wave elements.

5. The elastic boundary wave device according to claim 2, wherein the acoustic velocity of at least one second dielectric layer from among the elastic boundary wave elements connected in series, and the acoustic velocity of the second dielectric layer of at least one elastic boundary wave element from among the elastic boundary wave elements connected in parallel are different from the acoustic velocity of the second dielectric layer of another of the elastic boundary wave elements.

6. The elastic boundary wave device according to claim 2, wherein the acoustic velocity of the second dielectric layer of at least one elastic boundary wave element from among the elastic boundary wave elements connected in series is different from the acoustic velocity of the second dielectric layer of another of the elastic boundary wave elements.

7. The elastic boundary wave device according to claim 1, wherein the piezoelectric material layers have each been formed from $LiNbO_3$ or $LiTaO_3$.

8. The elastic boundary wave device according to claim 1, wherein the first dielectric layers include $SiO_2$ as a main component.

9. The elastic boundary wave device according to claim 1, wherein the second dielectric layers include, as a main component, any one selected from the group consisting of alumina, SiN, SiC, and diamond-like carbon.

10. The elastic boundary wave device according to claim 1, wherein a formation method for the second dielectric layer of at least one elastic boundary wave element from among the plurality of elastic boundary wave elements is different from a formation method for the second dielectric layer of another of the elastic boundary wave elements.

* * * * *

UNITED STATES PATENT AND TRADEMARK OFFICE
CERTIFICATE OF CORRECTION

| | | |
|---|---|---|
| PATENT NO. | : 7,915,786 B2 | Page 1 of 1 |
| APPLICATION NO. | : 12/705565 | |
| DATED | : March 29, 2011 | |
| INVENTOR(S) | : Takashi Matsuda et al. | |

It is certified that error appears in the above-identified patent and that said Letters Patent is hereby corrected as shown below:

Title Page:

In (73)    Assignee, please correct the Assignee's Information to read as follows:

(73)    Taiyo Yuden Co., Ltd., Taito-ku, Tokyo (JP)

Signed and Sealed this
Thirty-first Day of May, 2011

David J. Kappos
*Director of the United States Patent and Trademark Office*